(12) United States Patent
Zhou et al.

(10) Patent No.: US 8,881,378 B2
(45) Date of Patent: Nov. 11, 2014

(54) METHOD TO IMPROVE PERFORMANCE OF A MAGNETO-RESISTIVE (MR) SENSOR

(75) Inventors: Yuchen Zhou, San Jose, CA (US); Joe Smyth, Aptos, CA (US); Min Li, Fremont, CA (US); Glen Garfunkel, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 435 days.

(21) Appl. No.: 13/199,183

(22) Filed: Aug. 22, 2011

(65) Prior Publication Data

US 2013/0049747 A1  Feb. 28, 2013

(51) Int. Cl.
*G11B 5/127* (2006.01)
*H04R 31/00* (2006.01)
*G01R 33/09* (2006.01)
*B32B 38/10* (2006.01)
*B32B 37/02* (2006.01)

(52) U.S. Cl.
CPC .............. *G01R 33/098* (2013.01); *B32B 38/10* (2013.01); *B32B 37/02* (2013.01); *B32B 2309/105* (2013.01); *B32B 2457/08* (2013.01); *B32B 2307/212* (2013.01)
USPC .................. 29/603.14; 29/603.13; 29/603.15; 29/603.16; 29/603.18; 360/324.1; 360/324.11; 360/324.12; 360/324.2; 216/62; 216/65; 216/66

(58) Field of Classification Search
USPC .............. 29/603.07, 603.13–603.16, 603.18; 360/324.1, 324.2, 324.11, 324.12; 216/62, 65, 66; 427/127–131
See application file for complete search history.

(56) References Cited

U.S. PATENT DOCUMENTS

| | | | |
|---|---|---|---|
| 5,867,889 A * | 2/1999 | Dovek et al. ............... | 29/603.13 |
| 5,930,084 A | 7/1999 | Dovek et al. | |
| 6,239,955 B1 | 5/2001 | Dovek et al. | |
| 6,297,987 B1 * | 10/2001 | Johnson et al. ............... | 365/158 |
| 6,519,124 B1 | 2/2003 | Redon et al. | |
| 6,597,546 B2 * | 7/2003 | Gill .............................. | 360/321 |
| 6,873,499 B2 | 3/2005 | Lee et al. | |
| 7,126,796 B2 * | 10/2006 | Lin ............................... | 360/322 |
| 7,170,721 B2 | 1/2007 | Wu | |
| 7,203,036 B2 * | 4/2007 | Chattopadhyay et al. .... | 360/313 |
| 7,268,985 B2 * | 9/2007 | Freitag et al. ............. | 360/324.12 |
| 7,330,339 B2 * | 2/2008 | Gill .......................... | 360/324.11 |
| 7,420,788 B2 * | 9/2008 | Pinarbasi .................. | 360/324.11 |
| 2007/0247763 A1 * | 10/2007 | Boone et al. .................. | 360/313 |

* cited by examiner

*Primary Examiner* — Paul D Kim
(74) *Attorney, Agent, or Firm* — Saile Ackerman LLC; Stephen B. Ackerman; Rosemary L.S. Pike

(57) ABSTRACT

A method is described to improve performance of a magneto-resistive (MR) sensor under conditions of high areal density. The free layer is partially etched away, the removed material being replaced by a magnetic flux guide structure that reduces the free layer's demagnetization field. This in turn reduces the stripe height of the sensor so that the resolution and the read-back signal are enhanced without increasing noise and instability.

12 Claims, 6 Drawing Sheets

Cross-section view

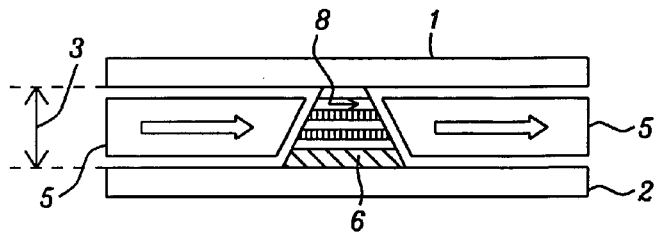
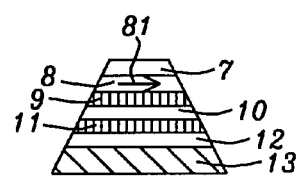
FIG. 1A – Prior Art   FIG. 1B – Prior Art
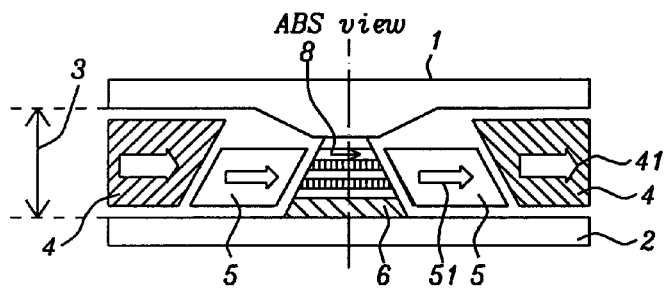
FIG. 2A
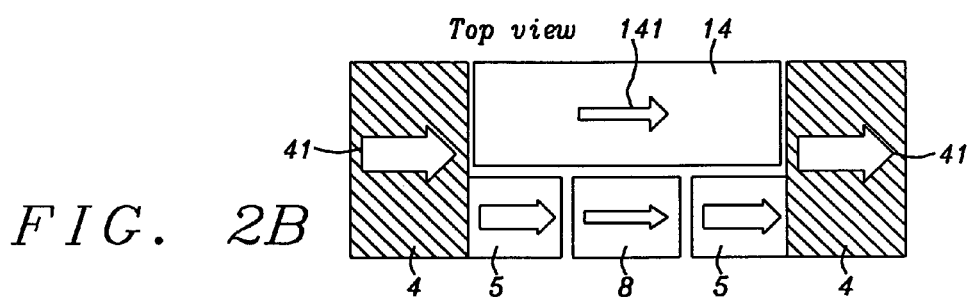
FIG. 2B
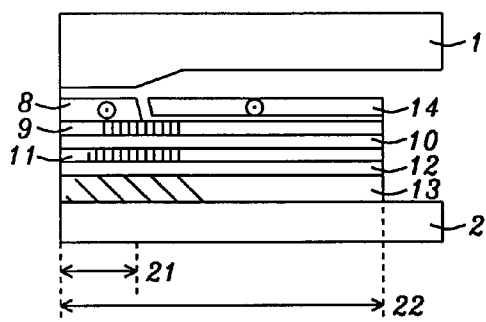
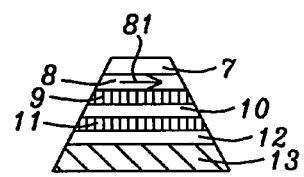
FIG. 2C   FIG. 2D

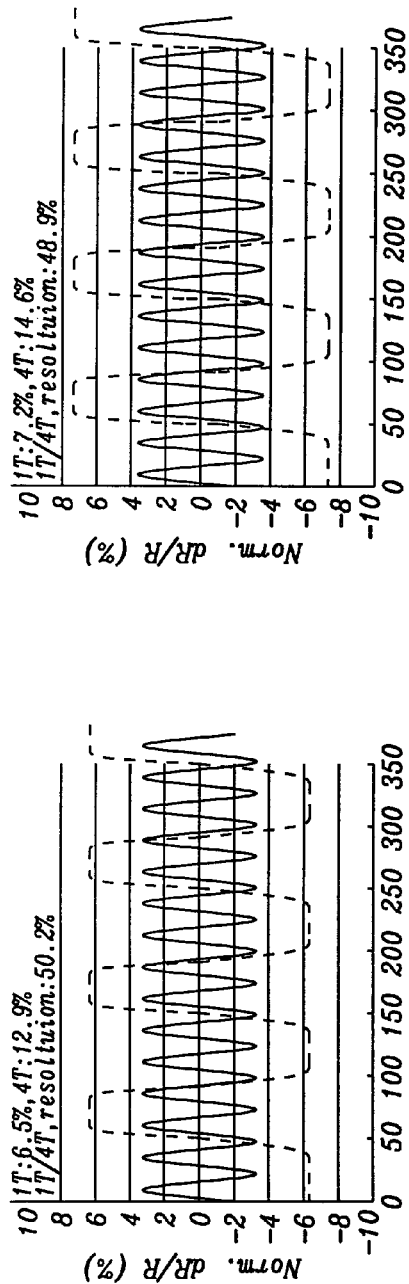
FIG. 4A
FIG. 4B
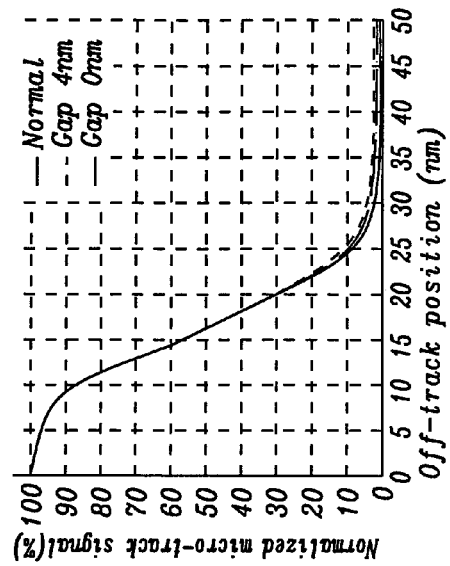
FIG. 4C
FIG. 4D

METHOD TO IMPROVE PERFORMANCE OF A MAGNETO-RESISTIVE (MR) SENSOR

FIELD OF THE INVENTION

The invention relates to the general field of sensing magnetically recorded data with particular reference to very high data densities.

BACKGROUND OF THE INVENTION

With an ever-increasing data areal density in hard disk drives (HDD), the magneto-resistive (MR) sensor that is used as the read-back element in HDDs is required to have correspondingly better spatial resolution while at the same time achieving reasonable signal-to-noise ratio (SNR). FIG. 1 shows the structure of a generic TMR (tunneling-magneto-resistive) head which is the main MR sensor structure used in state-of-the-art HDD.

As seen in FIG. 1A, a generic TMR head has top and bottom reader shields 1 and 2 respectively, spaced distance 3 apart, hard bias (HB) magnets 5 on the sides and MR sensor stack 6 located between the reader shields. FIG. 1B shows conventional MR sensor stack 6 that includes free layer (FL) 8, tunneling barrier 9, reference layer 10, anti-parallel coupling layer 11 of Ru, pinned layer 12, and anti-ferromagnetic layer 13 beneath the pinned layer 12 to provide the pinned field on 12 and 10.

Between top shield 1 and free layer 8 is non-magnetic capping layer 7. The longitudinal magnetization of HB 5 provides a biasing magnetic field within sensor stack 6 to bias the magnetization 81 of free layer 8 in the cross-track direction. In today's hard disk drive, to further increase area data density, increased data linear density along both the down-track and cross-track directions is being developed. For higher track density, read heads with higher spatial resolution in the cross-track direction are required and smaller sensor sizes are needed. However, with smaller sensor size, magnetic noise gets worse as does sensor stability.

To overcome these magnetic noise and reduced stability problems, a stronger HB field is needed, but this also has the effect of making the sensor less sensitive. Furthermore, due to the smaller bit size within the medium, the field from the medium becomes smaller and so higher sensitivity sensors are required.

Thus, a trade-off exists between lower noise, better stability and higher signal. When solving this problem it is always beneficial to further increase the dR/R of the TMR film. This is, however, very hard to achieve in existing state-of-the-art TMR sensors. An Improved MR sensor design that can enhance the read-back signal without increasing noise and instability, are therefore needed.

A routine search of the prior art was performed with the following references of interest being found:

R. Olivier, and A. Satoru, "Magnetic tunnel junction read head using a hybrid, low-magnetization flux guide" see U.S. Pat. No. 6,519,124 B1 (2003). In U.S. Pat. No. 6,873,499, Lee et al. teach that a flux guide abuts the back edge of a read sensor. Dovek et al. in U.S. Pat. No. 6,239,955, show a flux guide on the back end of a MR sensor where the flux guide overlaps the lead and hard bias layers while Wu (in U.S. Pat. No. 7,170,721) discloses a flux guide on the side of a GMR element with permanent magnets surrounding the flux guide.

SUMMARY OF THE INVENTION

It has been an object of at least one embodiment of the present invention to provide a method for sensing magnetic data stored at densities of 450 TPI and track widths less than 56 nm without increasing noise and instability.

Another object of at least one embodiment of the present invention has been to provide a device that achieves the foregoing objectives.

Still another object of at least one embodiment of the present invention has been to also achieve an increased magneto-resistance ratio.

These objects have been achieved by a partial etching away of the free layer, the removed material being replaced by a magnetic flux guide structure that reduces the free layer's demagnetization field. This in turn reduces the stripe height of the sensor so that the resolution and the read-back signal are enhanced without increasing noise and instability.

Stabilization of the flux guide is achieved by providing it with its own longitudinal field generated by an additional pair of hard bias magnets or, alternatively, by an exchange structure.

The resulting device exhibits an on-track signal increase over existing MR sensor structures, enabling less-dependent optimization of sensor stability and sensitivity as well as better performance in densely recorded environments.

BRIEF DESCRIPTION OF THE DRAWINGS

FIGS. 1A-1B illustrate prior art devices

FIGS. 2A-2E show various views of a first embodiment of the invention

FIG. 4A-4D contrast the down-track waveforms of a conventional sensor with those generated by the invention.

DESCRIPTION OF THE PREFERRED EMBODIMENTS

Figure 2E:
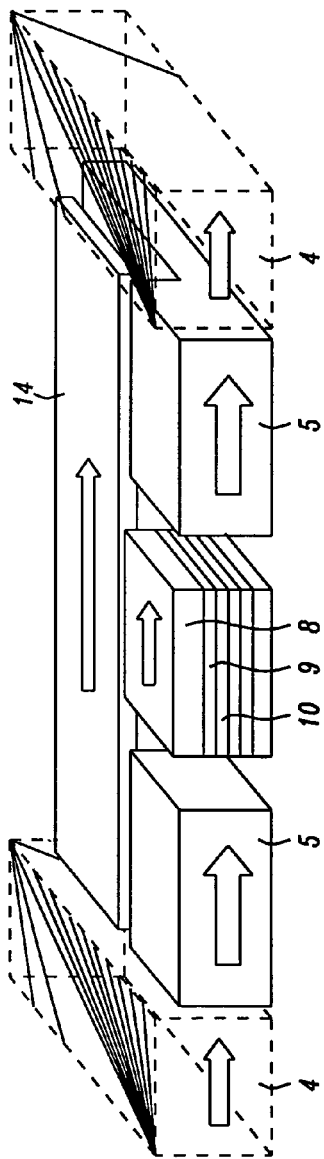

FIGS. 2A-2E show various schematic views of the invention which introduces a novel back edge flux guide (FG) sensor design. The views provided in FIGS. 2A-2E are, respectively, ABS, top-down, cross-sectional (taken at sensor width center), MR stack close-up (similar to the prior art), and three-dimensional.

FIG. 2A shows that the FG sensor has a conventional MR stack structure 6 including a pair of conventional hard bias magnets (HB 5) for biasing free layer 8, as seen in prior art FIG. 1. In an important departure from the prior art, a second pair of hard bias magnets (HB 4) is provided for biasing FG 14, the latter being located along the back edge of the sensor stack as shown in FIG. 2B.

FIG. 2C further details how the FG is located along the back edge of the sensor stack. In prior art designs free layer 8 extends almost all the way to the back edge which results in the large stripe height (SH) 22. In the present invention, however, FL 8 has been subjected to controlled etching (which may also involve full or partial removal of the MR junction layer 9). Consequently, the initially large SH of the FL has been reduced to the much smaller SH of 21, also as shown in FIG. 2C. This is another important novel feature of the invention.

After etching at the back end of the sensor stack, tunneling barrier 9 or reference layer 10 is exposed. A thin non-magnetic insulation layer such as alumina is then deposited on this exposed surface, followed by the deposition, and patterning, of the thin FG layer 14 on this thin non-magnetic insulation layer. The edge of FG layer 14 that faces the FL must be separated from the FL back-edge by a distance that does not exceed the thickness of the FL.

The flux guide's thickness should be similar to the free layer thickness of from 2 to 10 nm with from 4 to 8 nm being preferred. Other properties of the flux guide include:

a. Hk<~50 Oe and Hc<~5 Oe.

b. Preferred material is Permalloy with Ni(81%)Fe(19%) or CoNiFe alloys with appropriate oftness as the permalloy.

When FL magnetization 81 rotates in plane, it generates a magnetic field in FG layer 14 which causes magnetization 141 of the FG layer to rotate correspondingly. This magnetostatic interaction is the basic mechanism behind the magnetic flux guide effect since it enables the free layer to undergo a larger magnetization rotation when exposed to the same medium magnetic field it normally experiences. Additionally, as mentioned above, etching the FL also removes the top layer of HB 5 thereby leaving a cavity within which a large FG layer may be located.

After a second isolation layer has been deposited on FG layer 14, outer hard bias magnets HB 4 are formed to stabilize the FG layer magnetization. This is followed by the formation of top shield 1.

Once fabrication of the sensor is completed, a single HB initialization field is used to orient both the HB 4 and HB 5 magnetizations along the same direction. This will also orient the FL and FG layer magnetizations to be in the same direction once the initialization field has been removed. HB 4 serves mainly to stabilize the FG magnetization but it can also stabilize the HB 5 at the same time. Thus, the sensor may have a thick HB 4 and much thinner HB 5 which is an advantage in narrow read gap applications. FIG. 2E is a schematic three dimensional view of the completed FG sensor.

Benefits of the Invention

Figure 3:
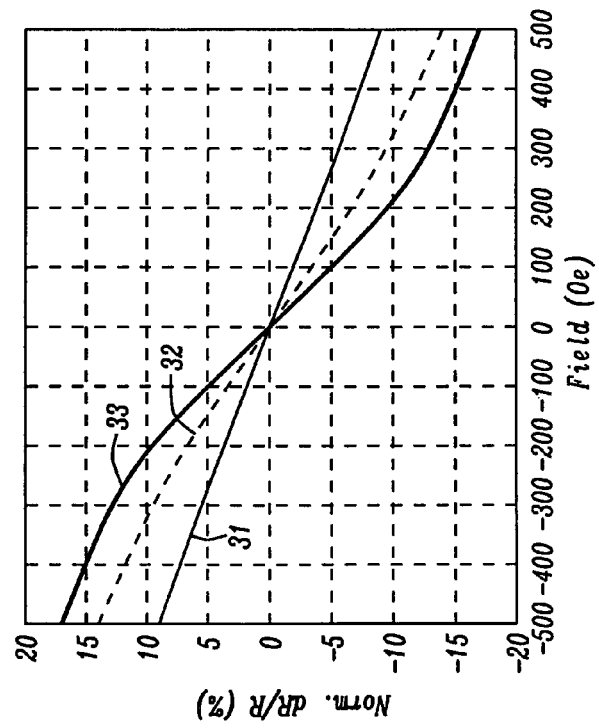
FIG. 3 compares dR/R for the invention and for a prior art device as a function of magnetic field applied normal to the sensor's ABS.

FIG. 3 shows a simulated transfer curve for comparison between conventional and FG sensor structures. The x-axis is a magnetic field applied normal to the sensor's ABS and y-axis is the sensor's output expressed as % dR/R. Curve 31 is the transfer curve for the conventional sensor shown in FIG. 1 while curves 32 and 33 are transfer curves for the invented FG sensor, with the gap between the ABS and the free layer's back edge being 5 nm and close to 0 nm respectively. The corresponding amplitude gains by the FG structure are 50% and 90% respectively.

FIGS. 4A-4D shows a simulated on-track read-back signal comparison between a prior art sensor and the invented FG sensor.

FIG. 4A shows the 1T and 4T down-track waveforms from a conventional sensor (FIG. 1). The percentage numbers above the figure are 1T signal, 4T signal peak-to-peak amplitudes and 1T/4T resolution, the latter quantity being a measure of the sensor response difference between the high and the low frequency regions.

FIGS. 4B and 4C show the same plots as in FIG. 4A but with the invented FG structure having FG-FL gaps of 5 nm and close to 0 nm respectively. The presence of the FG also enhances the read-back signal by 13% and 30% respectively; for this case the invented sensor has basically same structure as the sensor of FIG. 4A, except for the addition of the FG.

FIG. 4D shows the off-track amplitude profiles for the prior art sensor and for the invented FG sensor with a FG-FL gap of 5 nm or 0 nm. The profiles have been normalized to the on-track signal amplitude. The width of the profiles is a measure of the cross-track resolution of the sensor. The full-width at half-maximum is ~16 nm for all three conditions, indicating that the invented FG sensor has the same cross-track resolution as a conventional prior art sensor having no FG.

Figure 5A:
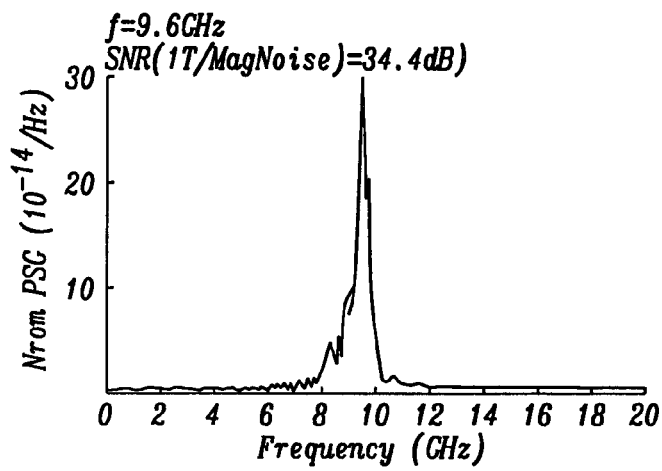
FIG. 5A-5C compares the simulated mag-noise spectrum of a prior art sensor with the invented device for two distances between the free layer and the flux guide.
Figure 5B:
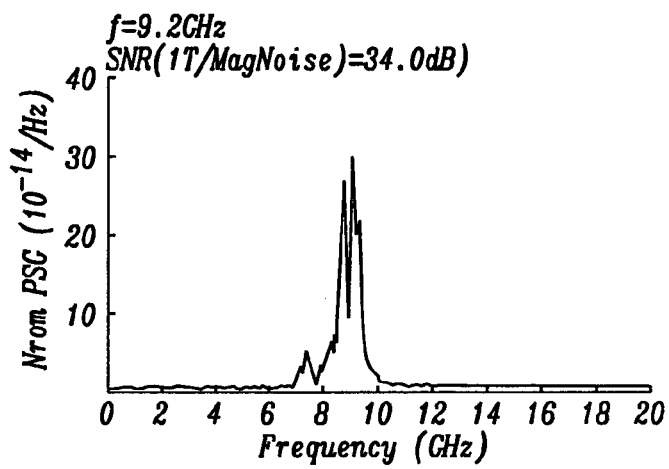
Figure 5C:
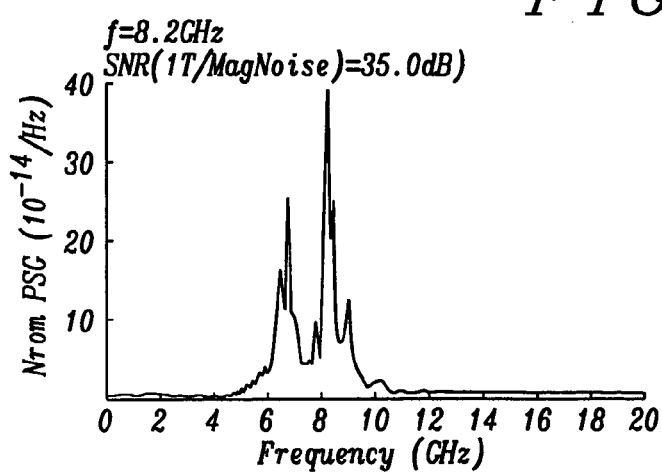

FIG. 5A shows the simulated mag-noise spectrum of a prior art sensor while FIGS. 5B and 5C show the same spectrum from the invented FG sensor with FG-FL gaps of 5 nm and 0 nm respectively. As can be seen, relative to the prior art sensor, the invented FG sensor's major mag-noise peaks have moved to lower frequency, indicating an effectively lower hard bias field. Also, the secondary lower amplitude peaks that appear at the lower frequency of 6-7 GHz derive from a FG magnetization resonance mode. However, the overall SNR, calculated from the ratio of 1T signal power as in FIG. 4 divided by the integrated mag-noise power in the 0-2 GHz range still shows an increase over the conventional sensor case for a FG-FL gap of 0 nm.

Figure 6:
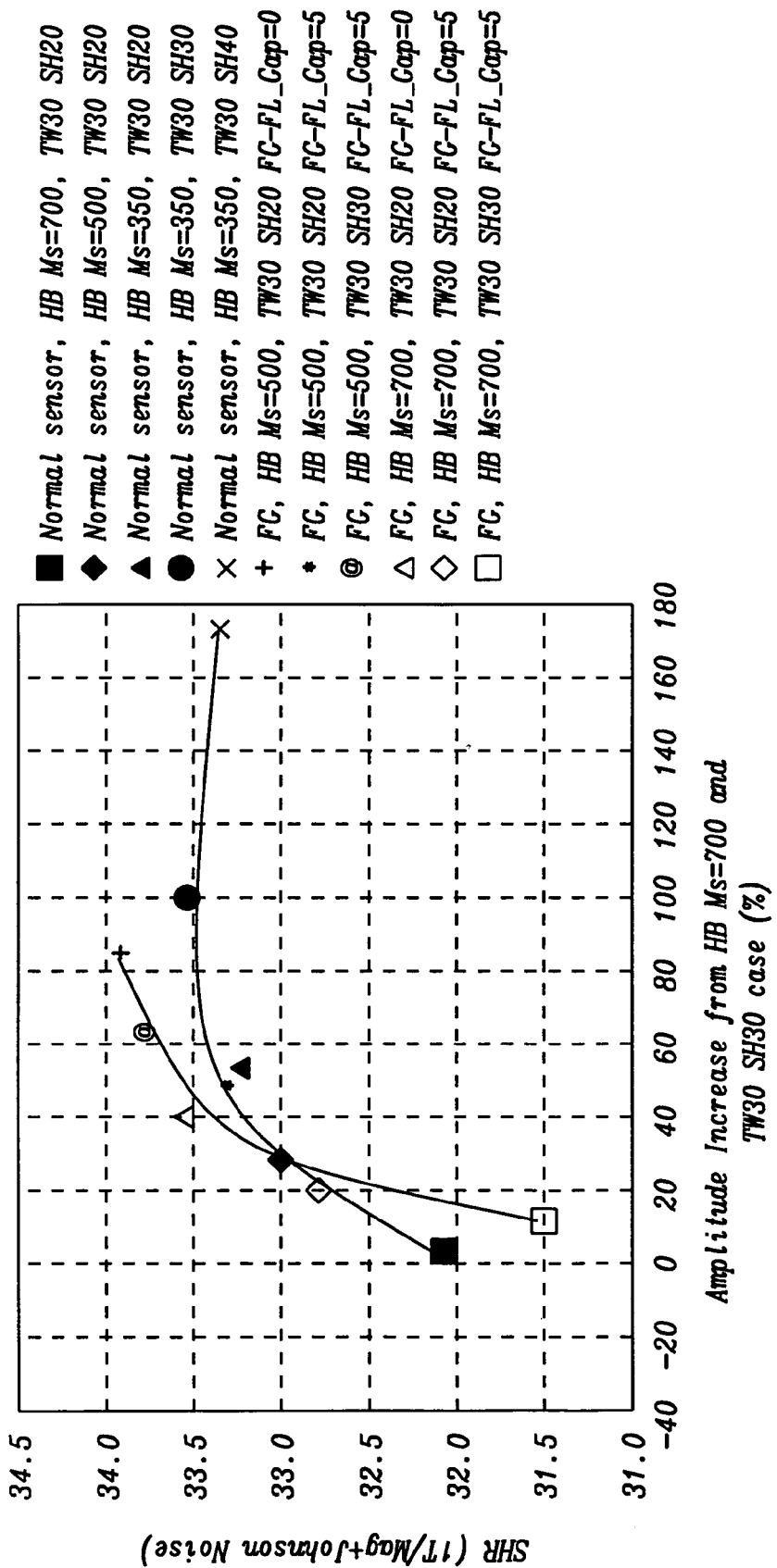
FIG. 6 shows the relationship between signal-to-noise ratio and longitudinal bias for the invented device as well as for several prior art designs.
Figure 7:
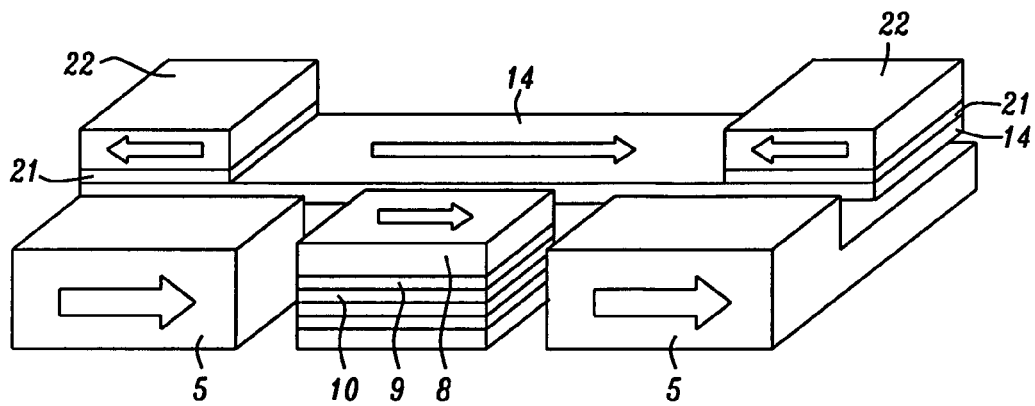
FIGS. 7 and 8 illustrate two additional embodiments of the invention.
Figure 8:
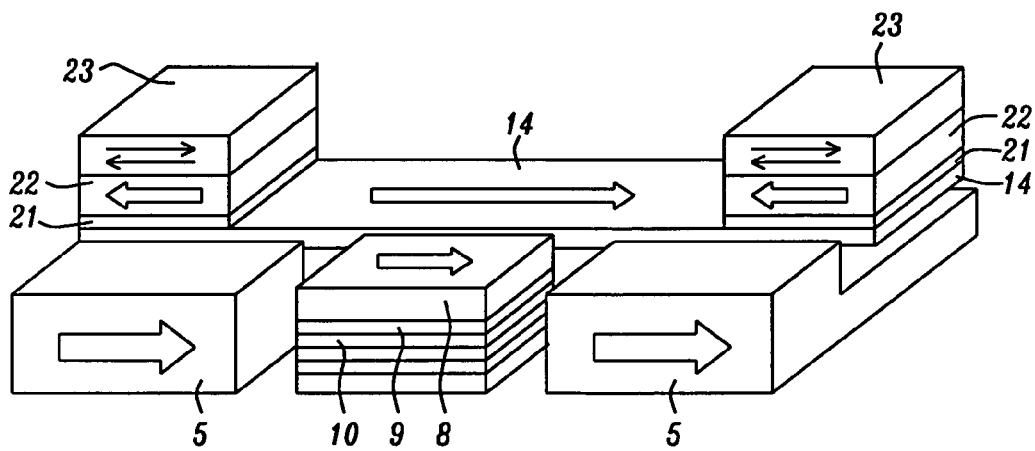

For a more realistic comparison, FIG. 6 shows the simulated SNR for a prior art sensor and for several FG sensors having different structural and HB conditions. The x-axis shows the sensor signal amplitude increase over that of a conventional sensor with HB Ms=700 emu/cc, track width (TW)=30 nm and SH=30 nm. The y-axis is the SNR calculated by using 1T signal power as in FIG. 4, mag-noise power integrated from 0-2 GHz of spectra in FIG. 5 and Johnson white electrical noise within the same frequency range.

Discussion

For a conventional sensor, an amplitude increase can be the result of a HB strength reduction, i.e. lower HB Ms as in various cases in FIG. 6, and also from larger SH used to enhance SH direction sensitivity. However, in FIG. 6 curve 61 (conventional sensor) shows the SNR saturating at ~33.5 dB due to a strong mag-noise increase at low HB and large SH which offsets the amplitude gain. For the invented FG sensor structure, amplitude is by reduced SH, reduced FG-FGL gap and lower HB Ms. Curve 62 in FIG. 6 corresponding to SNR vs amplitude increase of FG sensors breaks through the dashed line of curve 61 for an effective SNR gain over a conventional sensor.

Note that the prior art [1] also mentions a FG type of sensor structure that utilizes a large flux guide layer, which either also serves as the free layer or is exchange coupled to the free layer, while positioning the reference layer and pin layer structure at the back-end of this FG layer. The draw-back of this prior art design is the lower SNR when compared with the FG sensor design of the present invention. Flux leakage while traveling along the prior art FG is major source of signal loss. Additionally, for the narrower FG structure of the prior art, the weak stabilization of the ABS end FG magnetization by HB will lead to large mag-noise from the FG structure as well.

In Summary

The advantages of the disclosed FG MR sensor are:

1. An on-track signal increase over existing MR sensor structures
2. Enabling less-dependent optimization of sensor stability and sensitivity
3. Better performance for denser MR sensor.

Embodiments

Embodiment 1

The structure shown in FIG. 2.

Embodiment 2

The same as Embodiment 1 except that HB 4 as in FIG. 2 is in physical contact with HB 5 and FG layer 14. In this way, HB 4 stabilizes FG layer and HB 5 through direct exchange coupling.

Embodiment 3

The same as Embodiment 1, except that HB 4 is no existent and FG 14 edge magnetizations are stabilized by synthetic-anti-ferromagnetic (SAF) structures. Layer 21 is Ru layer and layer 22 is another magnetic layer with opposite magnetization to FG 14 and forms SAF structure with FG 14 edge magnetization Embodiment 4

The same as Embodiment 3, except that another anti-ferromagnetic layer (AFM) 23 exists on top of layer 22. AFM layer 23 stabilizes SAF structure composed of layer 14, 21 and 22 through exchange coupling at the two edges of FG 14.

What is claimed is:

1. A method to improve performance of a magneto-resistive (MR) sensor under conditions of high areal density, comprising:
   - forming, on a lower magnetic shield, a MR stack that further comprises a free layer on a tunneling barrier on a reference layer on an anti-parallel coupling layer on a pinned layer on an antiferromagnetic layer;
   - providing a first pair of hard bias magnets that flank said MR stack;
   - providing a second pair of hard bias magnets that flank said first pair of hard bias magnets;
   - selectively removing a portion of said MR stack and of said first pair of hard bias magnets until said free layer, and optionally some of said tunneling barrier, are removed, thereby forming an area of reduced thickness that extends inwards from a back edge for a first distance;
   - selectively covering said area of reduced thickness with a first layer of non magnetic insulation;
   - forming, on said first layer of non magnetic insulation, a flux guide having a thickness and a top surface that is coplanar with a top surface of said free layer, said flux guide extending from said back edge to within a second distance from said free layer;
   - depositing a second layer of non magnetic insulation on said flux guide;
   - then depositing an upper magnetic shield on said second layer of non magnetic insulation thereby forming said MR sensor; and
   - then exposing said MR sensor to an external magnetic field whereby said first pair of hard bias magnets provide a permanent stabilizing magnetic field for said free layer and said second pair of hard bias magnets provide a permanent stabilizing magnetic field for said flux guide.

2. The method recited in claim 1 wherein said first distance extended inwards from said back edge by said area of reduced thickness is in a range of from 25 to 2,000 nm whereby said MR sensor has a stripe height of less than 25 nm.

3. The method recited in claim 1 wherein said second distance between said flux guide and said free layer is in a range of from 1 to 3 nm.

4. The method recited in claim 1 wherein said second distance between said flux guide and said free layer is less than said flux guide thickness.

5. The method recited in claim 1 wherein said flux guide has a uniaxial anisotropy field that is less than 50 Oe and a coercivity that is less than 5 Oe.

6. The method recited in claim 1 wherein said MR sensor has a signal-to-noise ratio of at least 34.0.

7. A method to improve performance of a magneto-resistive (MR) sensor under conditions of high areal density, comprising:
   - forming, on a lower magnetic shield, a MR stack that further comprises a free layer on a tunneling barrier on a reference layer on an anti-parallel coupling layer on a pinned layer on an antiferromagnetic layer;
   - providing a pair of hard bias magnets that flank said MR stack;
   - selectively removing a portion of said MR stack and of said pair of hard bias magnets until said free layer, and optionally some of said tunneling barrier, are removed, thereby forming an area of reduced thickness that extends inwards from a back edge for a first distance;
   - selectively covering said area of reduced thickness with a first layer of non magnetic insulation;
   - forming, on said first layer of non magnetic insulation, a ferromagnetic flux guide having a thickness and a top surface that is coplanar with a top surface of said free layer, said flux guide extending from said back edge to within a second distance from said free layer;
   - depositing, in succession on said flux guide, a layer of an anti-parallel coupling material, a layer of ferromagnetic material and, optionally, a layer of antiferromagnetic material;
   - then patterning said layers of an anti-parallel coupling material, a ferromagnetic material, and an optional antiferromagnetic material into opposing stacks in alignment with said pair of hard bias magnets, thereby forming a pair of synthetic antiferromagnetic structures that are exchange coupled to said flux guide;
   - depositing a second layer of non magnetic insulation on said flux guide and on said pair of synthetic antiferromagnetic structures ;
   - then depositing an upper magnetic shield on said second layer of non magnetic insulation thereby forming said MR sensor; and
   - then exposing said MR sensor to an external magnetic field whereby said pair of hard bias magnets provide a permanent stabilizing magnetic field for said free layer and said opposing pair of synthetic antiferromagnetic structures provide a permanent stabilizing magnetic field for said flux guide.

8. The method recited in claim 7 wherein said first distance extended inwards from said back edge by said area of reduced thickness is in a range of from 25 to 2,000 nm whereby said MR sensor has a stripe height of less than 35 nm.

9. The method recited in claim 7 wherein said layer of an anti-parallel coupling material is ruthenium.

10. The method recited in claim 7 wherein said second distance between said flux guide and said free layer is less than said flux guide thickness.

11. The method recited in claim 7 wherein said flux guide has a uniaxial anisotropy field that is less than 50 Oe and a coercivity that is less than 5 Oe.

12. The method recited in claim 7 wherein said MR sensor has a signal-to-noise ratio of at least 34.0.

* * * * *